United States Patent [19]
Sekiguchi et al.

[11] Patent Number: 6,008,124
[45] Date of Patent: Dec. 28, 1999

[54] SEMICONDUCTOR DEVICE HAVING IMPROVED LAMINATION-STRUCTURE RELIABILITY FOR BURIED LAYERS, SILICIDE FILMS AND METAL FILMS, AND A METHOD FOR FORMING THE SAME

[75] Inventors: Mitsuru Sekiguchi, Kyoto; Michinari Yamanaka, Osaka, both of Japan

[73] Assignee: Matsushita Electric Industrial Co., Ltd., Osaka, Japan

[21] Appl. No.: 08/804,461

[22] Filed: Feb. 21, 1997

[30] Foreign Application Priority Data

Feb. 22, 1996 [JP] Japan .................................... 8-034512

[51] Int. Cl.$^6$ .......................... H01L 21/425; H01L 21/44; H01L 21/4763
[52] U.S. Cl. .......................... 438/653; 438/528; 438/643; 438/648; 438/656; 438/651; 438/655; 438/658; 438/918
[58] Field of Search ..................... 438/528, 597, 438/643, 648–651, 653, 655, 656, 658, 683, 918

[56] References Cited

U.S. PATENT DOCUMENTS

| | | | |
|---|---|---|---|
| 5,378,660 | 1/1995 | Ngan et al. | 438/656 |
| 5,389,575 | 2/1995 | Chin et al. | 437/190 |
| 5,397,744 | 3/1995 | Sumi et al. | 438/643 |
| 5,545,592 | 8/1996 | Iacoponi | 437/200 |
| 5,550,079 | 8/1996 | Lin | 438/587 |
| 5,656,546 | 8/1997 | Chen et al. | 438/586 |

FOREIGN PATENT DOCUMENTS

| | | |
|---|---|---|
| 4-196526 | 7/1992 | European Pat. Off. . |
| 0 631 309 | 12/1994 | European Pat. Off. . |
| 62-169412 | 7/1987 | Japan . |
| 7-161659 | 6/1995 | Japan . |

OTHER PUBLICATIONS

Hornstrom, S.E. et al., TiN formed by ion beam nitriding of TiSi$_2$, Journal of Vacuum Science and Technology: Part A, vol. 7, No. 3, Part 01, May 1989, pp. 565–569, XP000126070 (abstract; Fig. 2).

Sekiguchi, M. et al., "Self–aligned barrier layer formation on TiSi$_2$ layer with N2 plasma treatment" Jun. –(18–20)–1996 Proceedings Thirteenth Intl. VLSI Multi-level Interconnection Conference (VMIC), Proceedings of Thirteeth Intl. VLSI Multilevel Interconnection (V–MIC) Conf 180–180E.

Y. Takegawa et al, A Highly Reliable Interconnection with Collimated Sputtering of Barrier Layer and High Temperature Sputtering of Al Alloy on Silicide Junction, 1993 International Conference on Solid State Devices and Materials, pp. 558–560.

Hiroshi Shinriki, et a., Selective CVD–Al Contact Plug on Rapid Thermal Processed TiSi2 in NH3 for High Speed CMOS Using Salicide Process, 1994 International Conference on Solid State Devices and Materials, pp. 946–948.

*Primary Examiner*—John F. Niebling
*Assistant Examiner*—Ha Tran Nguyen
*Attorney, Agent, or Firm*—McDermott, Will & Emery

[57] ABSTRACT

After formation of a connection hole or before deposition of an insulator film, a semiconductor device is placed onto a cathode of a plasma generator. A surface of a metal silicide film such as a silicide of titanium is exposed to a plasma of a nitrogen-containing gas at 550 degrees centigrade or less. As a result of such processing, a barrier compound layer, composed of a compound of nitrogen, oxygen, metal and silicon, is formed at a near-surface region of the metal silicide film of the titanium silicide film. Thereafter, while forming a buried layer from material superior in step coverage such as an Al—Ti compound and an aluminum alloy, reaction between the metal silicide film and the buried layer in a later annealing treatment can be avoided without depositing a barrier metal such as a titanium nitride/nitride film in the connection hole. Accordingly, contact resistance, sheet resistance and junction leakage can be reduced and reliability can be improved.

12 Claims, 15 Drawing Sheets

Fig. 7(a)
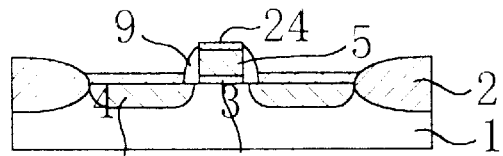
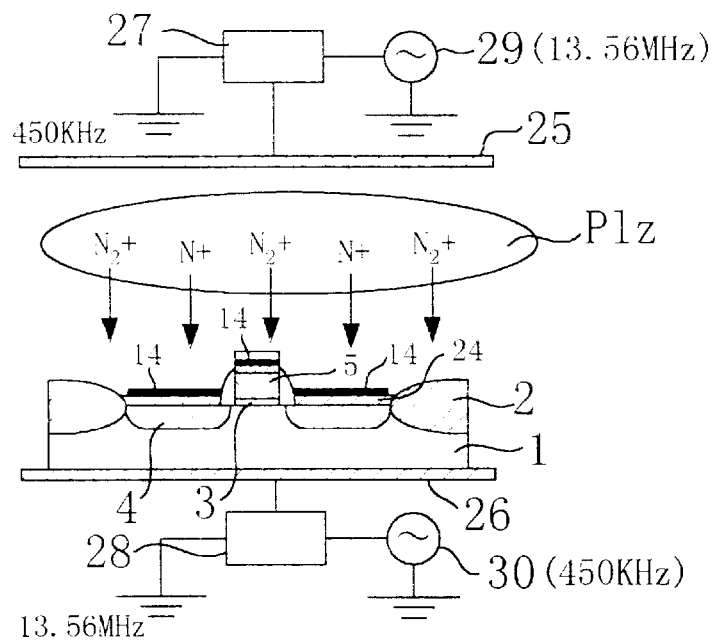
Fig. 7(b)
Fig. 7(c)
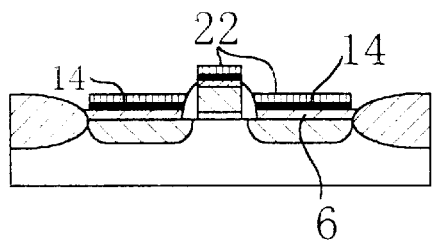
Fig. 7(d)
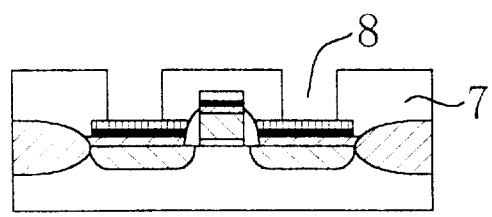
Fig. 7(e)
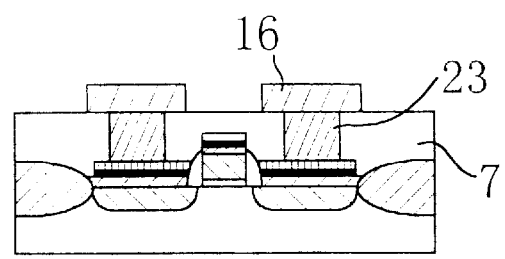

Fig. 12(a) Without plasma treatment
Fig. 12(b) With $N_2$ plasma treatment
Fig. 12(c) With $NH_3$ plasma treatment

SEMICONDUCTOR DEVICE HAVING IMPROVED LAMINATION-STRUCTURE RELIABILITY FOR BURIED LAYERS, SILICIDE FILMS AND METAL FILMS, AND A METHOD FOR FORMING THE SAME

BACKGROUND OF THE INVENTION

The present invention relates to a semiconductor device with a silicide film and to a method of fabricating such a semiconductor device. This invention pertains particularly to providing an improved structure for a contact portion between silicide and upper-level wiring or upper low-resistance metal.

In recent years, the level of VLSI integration and density has been improved dramatically. A technique, known in the art as self-aligned silicidation (SALICIDE), has been used. In a SALICIDE technique, a metal silicide film is formed, in self-aligned manner, on a gate electrode and source/drain region of a MOS transistor incorporated into a VLSI, for reduction of the sheet resistance of the gate electrode and source/drain region and for reduction of the parasitic resistance such as contact resistance and diffusion resistance, to improve the operation rate of semiconductor element.

Various methods of forming a buried layer composed of aluminum, tungsten and copper on top of a metal silicide film, have been proposed. One such formation technique is a high-temperature sputtering method which makes utilization of the flowability of aluminum alloy at high temperature. Another formation technique is a CVD (chemical vapor deposition) method which is known to provide good step coverage. More specifically, a metal, such as aluminum, tungsten and copper, is selectively deposited in a connection hole, to form a highly reliable buried layer. However, this may produce the problem that reaction occurs at a location where the metal forming the buried layer and a metal silicide film contact with each other. In other words, each of high-temperature sputtering, selective CVD and CVD for formation of upper-level wiring undergoes thermal hysterisis of approximately 450–600 degrees centigrade. Due to the thermal hysterisis, the aforesaid reaction occurs to produce a reaction product. The silicon substrate is eroded by this reaction product and junction leakage may occur. In order to control and suppress such reaction, it is a general practice to form a barrier metal such as titanium nitride between a buried layer and a metal silicide film.

With reference to FIGS. 15(a)–(d), a commonly-used method is illustrated in which a buried layer is formed on a metal silicide film by high-temperature sputtering.

Referring first to FIG. 15(a), a MOS transistor is formed overlying an active region that is surrounded by field oxide film 2 on top of silicon substrate 1. The MOS transistor comprises gate oxide film 3 of silicon oxide, gate electrode 5 of polysilicon, side-wall 9 of silicon oxide and source/drain region 4 formed by doping of impurities into silicon substrate 1. This is followed by deposition of, for example, a titanium film on source/drain region 4 and on the gate electrode 5 of the MOS transistor by sputtering. An anneal of from 600 to 900 degrees centigrade is performed and unreacted titanium films are stripped using an $H_2SO_4$—$H_2O_2$ combined solution. As a result, titanium silicide film 6 is selectively formed, more specially, only on source/drain region 4 and gate electrode 5.

Next, as shown in FIG. 15(b), insulator film 7 is formed overlying the entire surface of the substrate and connection hole 8 is formed in insulator film 7, extending to titanium silicide film 6 of source/drain region 4.

Referring to FIG. 15(c), (a) titanium as a titanium film for providing an improved characteristic of contact with titanium silicide film 6 on the source/drain region 4 and (b) titanium nitride as a barrier metal, are deposited in connection hole 8 as well as on insulator film 7 by sputtering to form titanium nitride/titanium film 19.

As shown in FIG. 15(d), titanium is sputtered and an aluminum alloy is then sputtered at 500 degrees centigrade. Al—Ti compound layer 15, resulting from combination of titanium and aluminum alloy, is formed and aluminum alloy film 16 is formed overlying Al—Ti compound layer 15. At this time, heat of reaction between Al and Ti is utilized, whereby connection hole 8 is filled with the aluminum alloy. Titanium nitride film 19, Al—Ti compound layer 15 and aluminum alloy film 16 are patterned by photolithography, to form metal wiring.

As the miniaturization of semiconductor device dimensions advances the miniaturization of connection hole diameter likewise advances. The deposition of titanium nitride film 19 by sputtering is not recommendable in the FIG. 15(c) process step. The reasons are as follows.

(1) Generally speaking, titanium nitride films, formed by sputtering, are poor in step coverage. This results in formation of an overhang at a corner of an upper portion of a connection hole, therefore preventing a flow of an aluminum alloy into the connection hole at the high-temperature sputtering time. Such a connection hole with an overhang suffers difficulty in being filed with aluminum alloy (see Y. Takegawa et al. Ext. Abst. SSDM, p. 558, 1993).

(2) To cope with such a problem, there is proposed a technique. In this technique, at the time of forming a titanium nitride film, titanium is sputtered through a honeycomb-like filter (collimator) in a flow of $N_2$ gas, to control the formation of overhangs. However, use of the collimator is likely to generate particles.

(3) In a process step shown in FIG. 15(b), an area other than connection hole 8, i.e., the area on insulator film 7, is also covered with titanium nitride/titanium film 19. This covering makes it impossible to employ a particular method (e.g., a selective CVD method which makes utilization of a difference between underlying layers) for selectively depositing a metal, such as aluminum, tungsten and copper, only in connection hole 8.

Various techniques have been proposed with a view to avoiding the above-noted problem. For instance, Shinriki et al. propose a technique (Ext. Abst. SSDM, p.968, 1994). In the technique, after formation of a connection hole an anneal is carried out in an ambient of $NH_3$ at a temperature of approximately 850 degrees centigrade without deposition of titanium nitride/titanium film 19, to form a titanium nitride film on top of a titanium silicide film. This is followed by selective deposition of aluminum only in the connection hole by selective CVD.

The above-described technique, however, produces the problem that, if heat in excess of 800 degrees centigrade is applied to a silicide of titanium, boron present in a source/drain region is driven into the titanium silicide. The value of the saturation current of p-channel transistors may decrease. Additionally, some metal silicides undergo silicide agglomeration when subjected to a high-temperature treatment, which results in an increase in sheet resistance of the source/drain region. The type of silicide applicable in the aforesaid conventional method is limited.

Such inconvenience occurs not only between a buried layer in a connection hole and a silicide film, it also occurs in forming a low-resistance metal film on top of a silicide film. This is a cause of decreasing reliability in a laminated structure of silicide and metal.

SUMMARY OF THE INVENTION

The present invention was made by finding the fact that, if a compound layer, composed of nitrogen, oxygen, metal and silicon, is formed in the vicinity of a boundary between a metal silicide film and an overlying metal film, this prevents a compound entry, which is a cause of the junction leakage, into a semiconductor substrate. It is an object of the present invention to provide an improved semiconductor device capable of (a) increasing lamination-structure reliability for buried layers, silicide films and metal films without having to use a barrier metal, (b) holding the sheet resistance of metal silicide film as low as possible and (c) preventing junction leakage from taking place, by forming a compound layer acting as a barrier, and to provide a method of fabricating such a semiconductor device.

The present invention provides a semiconductor device which comprises:
  (a) a semiconductor substrate;
  (b) a metal silicide film which is formed in a portion of the semiconductor substrate and which is composed of a silicide of a first metal;
  (c) a metal film which is formed overlying the metal silicide film and which is composed of a second metal; and
  (d) a barrier compound layer which is formed in a near-surface region of the metal silicide film and which is composed of a nitrogen-oxygen-first metal-silicon compound.

Owing to such formation of the barrier compound layer, composed of the aforesaid compound, on the petal silicide film, even when there has been hysterisis for high temperature during a fabrication step of depositing a metal film, reaction between the first metal constituting the metal silicide film and the second metal constituting the metal film, is suppressed. The occurrence of junction leakage and the characteristic degradation of gate oxide film are controlled without intervention of a barrier metal such as titanium nitride/nitride. As a result of such arrangement, inconveniences due to barrier metal with poor step coverage and due to poor resistance characteristic, such as a drop in reliability and an increase in sheet resistance, can be avoided.

It is preferred that the barrier compound layer is formed in a near-surface region of the entirety of the metal silicide film in the aforesaid semiconductor device.

The aspect of such arrangement is to provide a simple semiconductor device fabrication and to enhance resistance of the metal silicide film to chemical attack. The costs of production can be reduced.

It is preferred that the barrier compound layer is thick more than enough to prevent the second metal from diffusing into the barrier compound layer, and that the thickness of the barrier compound layer is 30 percent or less of that of the metal silicide film. From a different point of view, it is also preferred that the thickness of the barrier compound layer ranges from 2 nm to 20 nm.

As a result of such arrangement, not only the increase in contact resistance but also the increase in sheet resistance, both caused by formation of a barrier compound with an excessive thickness, is held as low as possible.

It is preferred in the aforesaid semiconductor device that a point at which the nitrogen contained in the barrier compound layer has a peak in the concentration, is deeper than a point at which the oxygen contained in the barrier compound layer has a peak in the concentration.

Accordingly, at a location where nitrogen concentration begins to increase, oxygen concentration begins to decrease relatively. A high-concentration area of an oxide layer, which is a cause of increasing contact resistance and sheet resistance, is controlled to be located in a near-surface region thereof. As a result of such arrangement, an increase in, for example, sheet resistance at a contact point of the metal film and the silicide film is held as low as possible.

It may be arranged such that:
  the semiconductor device of the present invention further includes an insulator film which is formed overlying the metal silicide film and a connection hole which is formed in a portion of the insulator film extending to the metal silicide film; and
  the metal film is a buried layer formed by deposition of the second metal in the connection hole.

Since the barrier compound is present at a near-surface region of the metal film that functions to suppress reaction between the first metal and the second metal, this eliminates the need for forming a barrier metal in a connection hole. This makes it possible to select a material with a good step coverage as the second metal used to form a buried layer in a connection hole that is required to have good step coverage. The reliability of semiconductor device is improved.

It may be arranged such that:
  the semiconductor device further includes:
    (a) an insulator film which is formed overlying the metal silicide film;
    (b) a connection hole which is formed in a portion of the insulator film, extending to said metal silicide film; and
    (c) a buried layer which is formed by deposition of a third metal in the connection hole.

Such arrangement makes it possible to select a low-resistance material to form a metal film as a second metal, and to place it between the buried layer and the metal silicide film. The present invention provides improved semiconductor devices which are low in contract resistance and which are suitable for the miniaturization of device dimensions.

It is preferred in the semiconductor device that the first metal is either titanium, cobalt, nickel, tantalum, tungsten, niobium, palladium, platinum or molybdenum.

It is preferred in the semiconductor device that the second metal is either an aluminum-containing metal, a copper-containing metal or a tungsten containing metal.

The present invention provides an improved method of fabricating a semiconductor device comprising:
  (a) a first step of forming on a semiconductor substrate a metal silicide film composed of a compound of a first metal and silicon;
  (b) a second step of forming, at a near-surface region of the metal silicide film, a barrier compound layer which is composed of a nitrogen-oxygen-first metal-silicon compound by illuminating a surface of the metal silicide film with nitrogen-containing ions either in an oxidation ambient or in a neutral ambient; and
  (c) a third step of forming a metal film by deposition of a second metal on top of the barrier compound layer of the metal silicide film.

In the second step of the above-described semiconductor device fabrication method of the present invention, the barrier compound layer is formed on top of the metal silicide film, which makes it possible to form a metal film without having to form a barrier metal. By adequately selecting and using as a second metal a material with a good step coverage, metal film-to-underlying layer step coverage can be improved and highly-reliable semiconductor devices can be fabricated.

It may be arranged such that:
(a) the semiconductor device fabrication method further includes:
    after the first step and before the second step, forming an insulator film on the metal silicide film;
    forming, by selective removal of a portion of the insulator film, a connection hole which extends to the metal silicide film;
(b) in the second step, the barrier compound layer is formed in an area of the near-surface region of the metal silicide film exposed to a bottom portion of the connection hole; and
(c) in the third step, the connection hole is filled with the second metal.

Accordingly, area used for barrier compound layer formation is limited to a particularly intended area and the increase in metal silicide film's sheet resistance is suppressed.

It may be arranged in the semiconductor device fabrication method such that:
(a) the semiconductor device fabrication method further includes:
    after the second step, forming an insulator film on the barrier compound layer of the metal silicide film;
    forming, by selective removal of a portion of the insulator film, a connection hole which extends to the barrier compound layer; and
(b) in the third step, the second metal is deposited in the connection hole.

Since the barrier compound layer is formed at every location, this eliminates the need for performing a step of forming a barrier compound layer every time a connection hole is formed, at the time of establishing contact from each wiring layer at any intended location of the metal silicide film. This provides a simplified semiconductor device fabrication method. Additionally, resistance of the metal silicide to chemical attack (e.g., HF attack) is improved thereby relaxing limitations on later fabrication steps.

It may be arranged such that the semiconductor device fabrication method further includes after the third step:
(a) forming an insulator film on the barrier compound layer of the metal silicide film;
(b) forming, by selective removal of a portion of the insulator film, a connection hole which extends to the barrier compound layer; and
(c) forming, by deposition of a third metal in the connection hole, a buried layer.

When a low-resistance material is selected as the second metal, a layer of low resistance is formed overlying the metal silicide film and the buried layer is formed overlying the low-resistance layer. This provides an improved semiconductor device with low resistance and good characteristics.

It may be arranged in the semiconductor device fabrication method such that:
in the second step, a plasma generator, in which a lower electrode as an anode and an upper electrode as a cathode are arranged in a chamber of the generator, is used; and
with the semiconductor substrate placed on the lower electrode, the metal silicide film is exposed to a plasma of a nitrogen-containing gas to form the barrier compound layer.

A semiconductor substrate is placed on the cathode so that nitrogen, which is a plus ion in a nitrogen plasma, is effectively taken into the metal silicide.

It may be arranged in the semiconductor device fabrication method such that in the second step a surface of the metal silicide film is illuminated either with ultraviolet light or with ionizing radiation while at the same time being exposed to a nitrogen-containing gas.

It may be arranged in the semiconductor device fabrication method such that in the second step a surface of the metal silicide film is exposed to nitrogen-containing ion beams to form the barrier compound layer.

It is preferred in the semiconductor device fabrication method that the second step is performed at 550 degrees centigrade or less.

Since plasma processing is performed at low temperature (below 550 degrees centigrade), no metal silicide aggregation occurs even when a silicide of titanium is employed, thereby providing a wide range of selecting a metal silicide.

The nitrogen-containing gas, used in the second step of the semiconductor device fabrication method, may be a gas of $N_2$.

Accordingly, a natural oxide film grown on top of the metal silicide film can be utilized in forming a barrier compound layer, and formation of a barrier compound layer, composed of a compound of nitrogen, oxygen, metal and silicon, can be facilitated.

It may be arranged such that:
(a) the semiconductor device fabrication method further includes, before the second step, removing a natural oxide layer grown on the metal silicide film by introducing a hydrogen-containing gas; and
(b) an oxygen-containing gas is added in the second step.

The oxygen concentration of the barrier compound layer becomes controllable, thereby making it possible to adjust the state of distribution of each element to a more preferable one.

It is preferred that in the second step of the semiconductor device fabrication method nitrogen-containing ions are doped into the metal silicide film at an ion energy of 3 keV or less.

This limits an area where the barrier compound layer is formed, to a depth of about 20 nm from the surface of the metal silicide film. As a result, the increase in semiconductor device contact resistance and the increase in semiconductor device sheet resistance are suppressed.

It is preferred that in the first step of the semiconductor device fabrication a silicide of any one of titanium, cobalt, nickel, tantalum, tungsten, niobium, palladium, platinum or molybdenum is used to form metal silicide.

It is preferred that in the third step of the semiconductor device fabrication method either an aluminum-containing metal, a copper-containing metal or a tungsten-containing metal is deposited using a CVD technique.

It may be arranged such that in the third step of the semiconductor device fabrication method titanium and aluminum are sputtered in succession so that the metal film is composed of an Al—Ti compound layer and an aluminum alloy film.

These arrangements make it possible to select a formation method for metal films and wiring, according to the type of semiconductor device and according to the difference between wiring layers which are formed on metal silicide.

BRIEF DESCRIPTION OF THE DRAWINGS

FIGS. 7(a)–(e) are cross-sectional views showing process steps of the fabrication of a semiconductor device in accordance with a fifth embodiment of the present invention.

PREFERRED EMBODIMENTS OF THE INVENTION

First Embodiment

FIGS. 1(a)–(d) schematically illustrate process steps used in the fabrication of a semiconductor device of a first embodiment of the present invention.

Figure 1A:
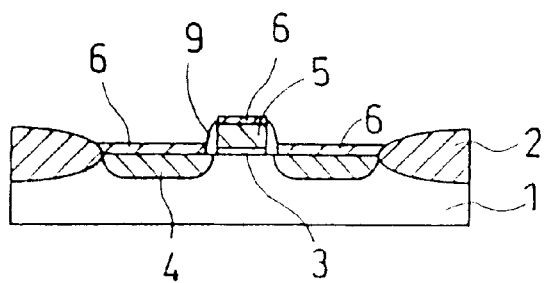
FIGS. 1(a)–(d) are cross-sectional views showing process steps of the fabrication of a semiconductor device in accordance with a first embodiment of the present invention.

With reference first to FIG. 1(a), formed on an active region which is surrounded by field oxide film 2 on silicon substrate 1 is a MOS transistor. The MOS transistor includes gate oxide film 3 of silicon oxide, gate electrode 5 of polysilicon, side-wall 9 of silicon oxide arid source/drain region 4 formed by doping of impurities into silicon substrate 1. Subsequently, a film of, for example, titanium is deposited on the substrate by sputtering. After an anneal of 650 degrees centigrade is performed, unreacted titanium films are removed using an $H_2SO_4$—$H_2O_2$ combined solution so that titanium silicide film 6 is selectively formed only on source/drain region 4 and on gate electrode 5, having a thickness of approximately 70 nm. An anneal of 850 degrees centigrade is performed for reduction of this resistance of the titanium silicide film.

Figure 1B:
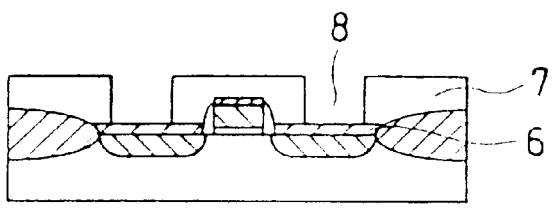

Next, as shown in FIG. 1(b), insulator film 7 is formed all over the substrate, to a thickness of approximately 800 nm. Connection hole 8 is formed in insulator film 7, extending to titanium silicide film 6 of source/drain region 4.

Figure 1C:
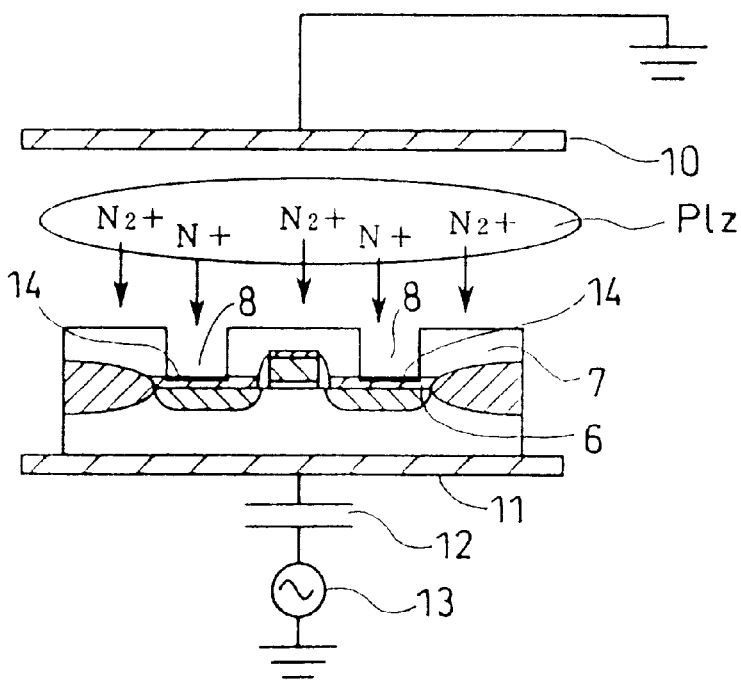

As shown in FIG. 1(c), a plasma generator, comprised of anode 10 and cathode 11 together forming a parallel-plate electrode, blocking capacitor 12 and high-frequency power supply 13, is used. The semiconductor device after the FIG. 1(b) process step is placed on cathode 11 mounted in a reaction chamber (not shown in the figure) so that a surface of titanium silicide film 6 is exposed to a plasma of a nitrogen-containing gas. For example, 100-percent $N_2$ gas is introduced at 50 degrees centigrade at 80 mTorr and power of about 300 W is applied between anode 10 and cathode 11 of the parallel plate electrode for 300 seconds. At this time, a nitrogen plasma Plz is created in the reaction chamber. The nitrogen in this nitrogen plasma Plz is a positive ion such as $N^+$ and $N^{2+}$, and a potential of 300 V (a plasma potential of about 60 V plus a self-bias of about 240 V) is generated in the direction of cathode 11. Ions of nitrogen are drawn toward the surface of the semiconductor device, at such a potential. In other words, by placing the semiconductor device on cathode 11, the doping of nitrogen into the surface of titanium silicide film 6 is accelerated. At this time, oxygen, contained in a natural oxide film grown on top of titanium silicide film 6, is also taken into titanium silicide film 6. As a result, barrier compound layer 14, composed of a nitrogen-oxygen-titanium-silicon compound, is formed at a near-surface region of titanium silicide film 6.

Figure 1D:
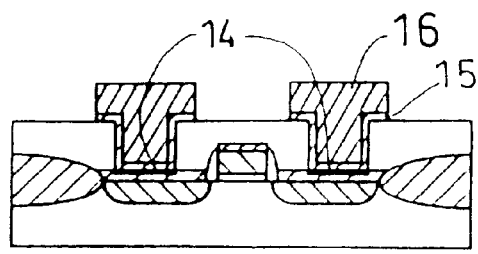

Next, as shown in FIG. 1(d), titanium is sputtered by a thickness of about 75 nm and an aluminum alloy, which has a content of 1% silicon and 0.5% copper, is sputtered at 500 degrees centigrade by a thickness of about 900 nm, whereby Al—Ti compound layer 15 (an aluminum alloy-titanium combination) and aluminum alloy film 16 overlying Al—Ti compound layer 15 are formed. Heat of reaction between Al and Ti is utilized so that connection hole 8 is filled with aluminum alloy to form a buried layer. Al—Ti compound layer 15 and aluminum alloy film 16 are patterned by means of photolithography, to form metal wiring.

Additionally, the following may be carried out. A connection hole is formed also on gate electrode 5 (at a different cross-section from the one shown in FIG. 1). Barrier compound layer 14 is formed at a near-surface region of titanium silicide film 6 on gate electrode 5. Al—Ti compound layer 15 and aluminum alloy film 16 are then deposited to form a buried layer and metal wiring.

Figure 2:
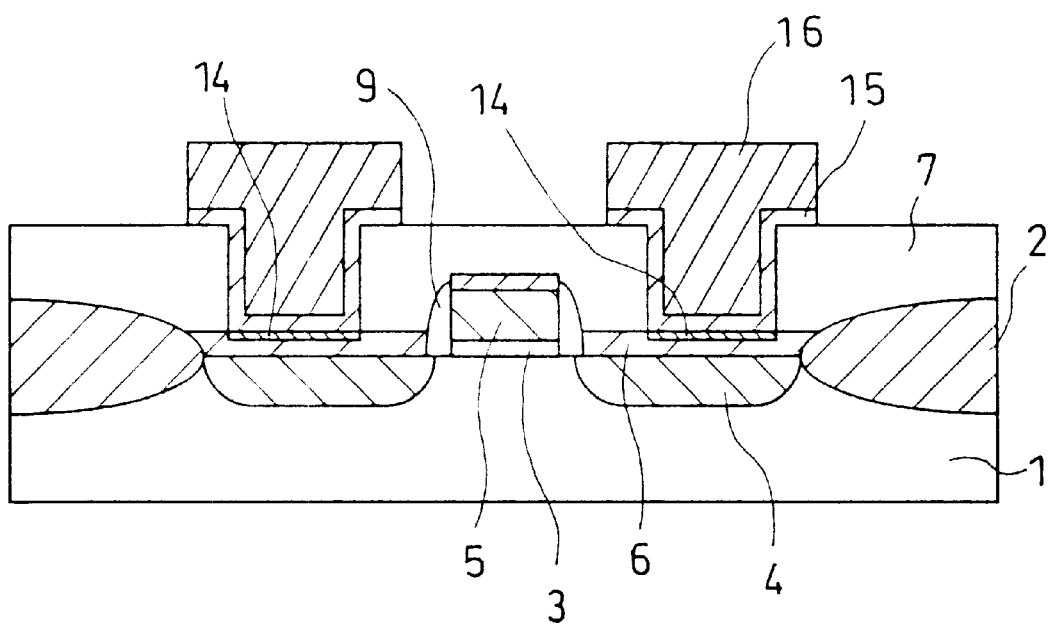
FIG. 2 shows in cross section a semiconductor device of the first embodiment.

FIG. 2 shows in cross section a semiconductor device fabricated in accordance with the above-described method. Formed on silicon substrate 1 is a MOS transistor comprising gate oxide film 3, gate electrode 5 of polysilicon, source/drain region 4, titanium silicide film 6 formed on source/drain region 4 as well as on gate electrode 5 and side-wall 9. Connection hole 8 is formed in insulator film 7 on the substrate, extending to titanium silicide film 6 on source/drain region 4. Formed in connection hole 8 and on insulator film 7 are Al—Ti compound layer 15 and aluminum alloy film 16 forming a buried layer and metal wiring. The semiconductor device of the present embodiment is characterized in that, instead of forming a barrier metal, such as titanium nitride/nitride, under aluminum alloy film 16, barrier compound layer 14, composed of a N—O—Ti—Si compound, is formed only on top of a portion of titanium silicide film 6 on source/drain region 4 which becomes a bottom for connection hole 8.

The structure of barrier compound layer 14 of the present embodiment is described in detail, and contact resistance, in the present semiconductor device, is discussed.

Figure 9:
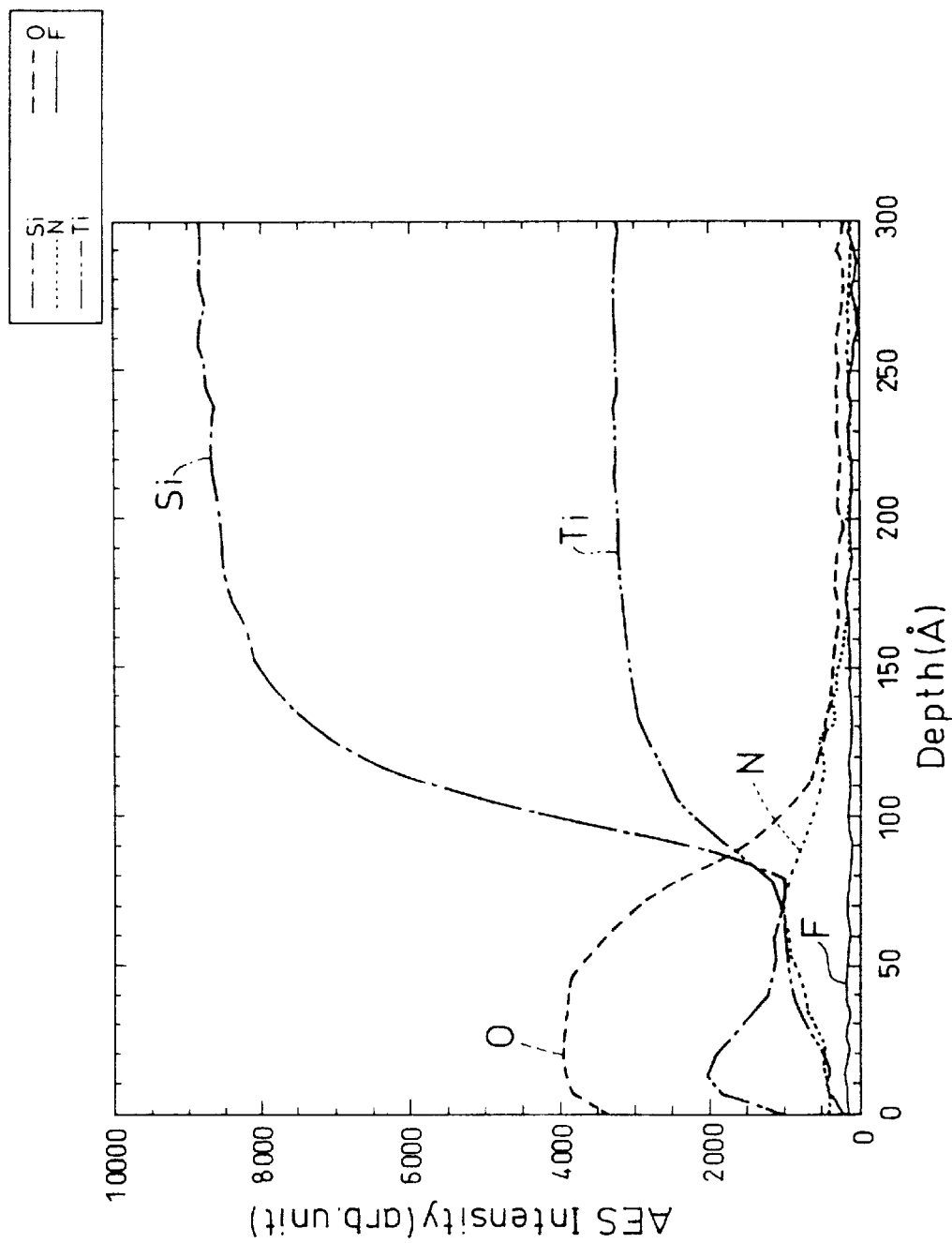
FIG. 9 shows analysis results of elements at a near-surface region of a titanium silicide film of a semiconductor device of the first embodiment.

FIG. 9 shows concentration profiles for individual elements obtained by analyzing a near-surface region of titanium silicide film 6 after the FIG. 1 process step by means of Auger electron spectroscopy. It is to be noted that, since each element has a different sensibility when analyzed by Auger electron spectroscopy, FIG. 9 does not show the exact elements composition but merely indicates each element's concentration distribution. As can be seen from FIG. 9, from the surface down to a depth of 2–3 nm, large quantities of silicon (Si) and oxygen (O) exist, which may be explained by the fact that a film of $SiO_2$, as a natural oxide film, was grown on top of the titanium silicide film in the process of the analysis. The barrier compound layer 14, composed of a nitrogen-oxygen-titanium-silicon compound, is formed under the $SiO_2$ film in a range of about 8 nm. The removal of the $SiO_2$ film located in the vicinity of the surface reveals that the concentration of oxygen peaks in the very close vicinity of the surface while the concentration of nitrogen peaks at a depth of about 4–5 nm below the $SiO_2$ film.

The reaction layer was too thin to analyze the state of bonding between each element in the barrier compound layer 14. However, from the fact that the standard formation heat of TiN is −73.0 kcal/mol, and −218.0 kcal/mol for $TiO_2$, −179.3 kcal/mol for $Si_3N_4$ and −202.5 kcal/mol for $SiO_2$, it may be believed that, when titanium silicide is used, oxygen bonds to titanium and silicon while nitrogen bonds mainly to silicon.

Although the formation of barrier compound layer 14 increases the sheet resistance from 2.6 $\Omega/\square$ up to 2.9 $\Omega/\square$, such an increase in sheet resistance is only about 10 percent. Such an increase is too low to affect the operation of transistor. In the present embodiment, barrier compound layer 14, composed of a compound of nitrogen, oxygen, titanium and silicon, is formed only on top of titanium silicide film within connection hole 8. As a result of such arrangement, the ratio of rise in sheet resistance of titanium silicide 6 by the aforesaid nitrogen plasma treatment, is further reduced.

Figure 10:
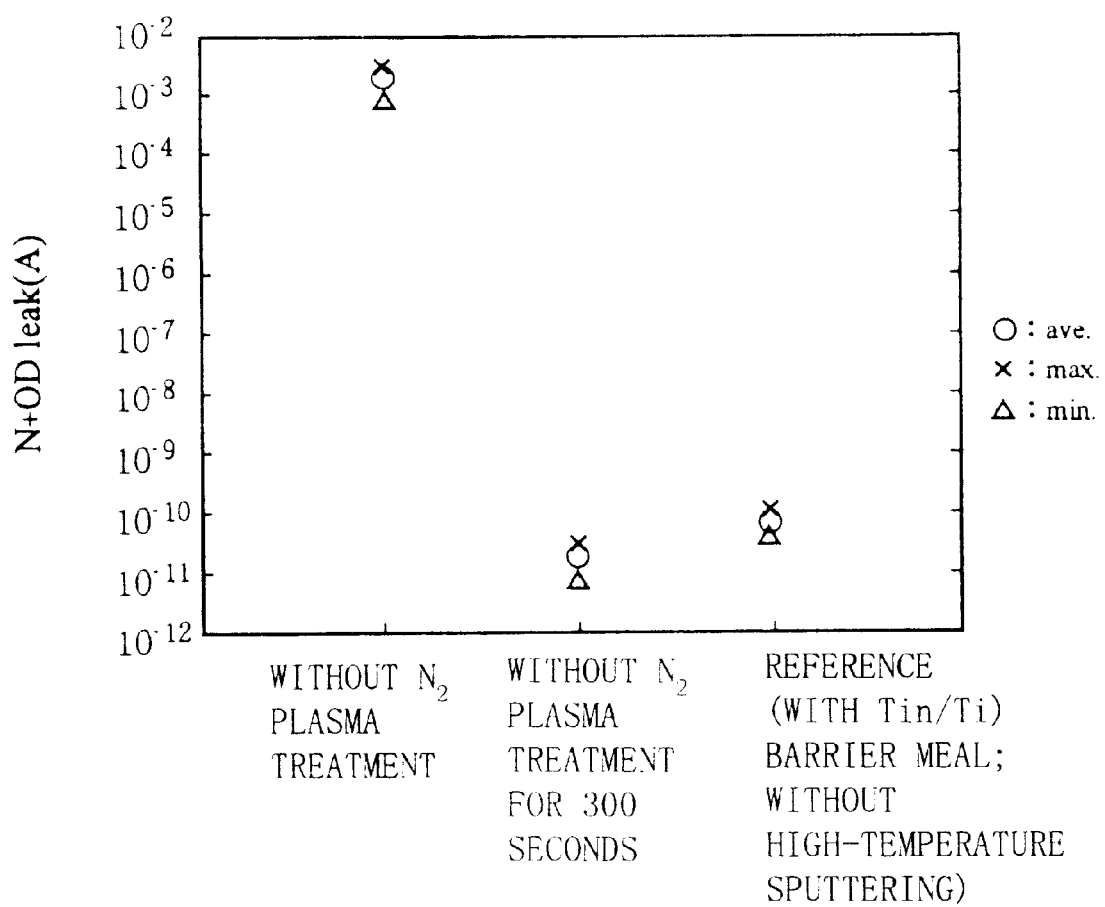
FIG. 10 is a diagram for comparison in junction leakage among (a) a sample without a nitrogen plasma treatment, (b) a sample with a treatment of the first embodiment and (c) a reference sample.

FIG. 10 is a diagram for comparison in junction leakage characteristic among (a) a sample without a nitrogen plasma treatment of FIG. 1(c), (b) a sample with a treatment of the present embodiment and (c) a reference sample formed in accordance with a commonly-used method shown in FIG. 15. The reference sample has a barrier metal composed of a TiN/Ti film and which has undergone no high-temperature sputtering. Note that junction leakage characteristics shown in FIG. 10 are those obtained by applying an reverse-direction voltage of 5.5 V to an 800-$\mu m^2$ $N^+P$ junction. As can be seen from FIG. 10, the without-$N_2$-plasma-treatment sample suffers a greater junction leakage. This may be explained by the fact that in the process step of FIG. 1(d) either aluminum alloy film 16 or Al—Ti compound layer 15 comes to react with titanium silicide film 6 in the sputtering of an aluminum alloy at 500 degrees centigrade, thereby causing aluminum to enter silicon substrate 1 to create junction leakage. Conversely, the sample with a nitrogen plasma treatment of the present embodiment, although it is provided with no barrier metal, is approximately identical in the level of junction leakage with the reference sample with a barrier metal and without a high-temperature sputtering treatment. This may be explained by the fact that barrier compound layer 14 functions to prevent, at the time of the aluminum alloy sputtering at 500 degrees centigrade, either aluminum alloy film 16 or Al—Ti compound layer 15 from reacting with titanium silicide film 6.

The contact resistance to an $N^+$ diffusion region of the present embodiment is 15$\Omega$ in the case of the sample with a nitrogen plasma treatment and with a 1.0 $\mu$m-square contact part, while in the case of the reference sample the contact resistance is 5$\Omega$. The sample of the present embodiment has a rather high contact resistance, but not so high as producing inconvenience to, for example, the operation of transistor. Additionally, it is proved that electrical connection with silicon substrate is sufficiently established.

Figure 11:
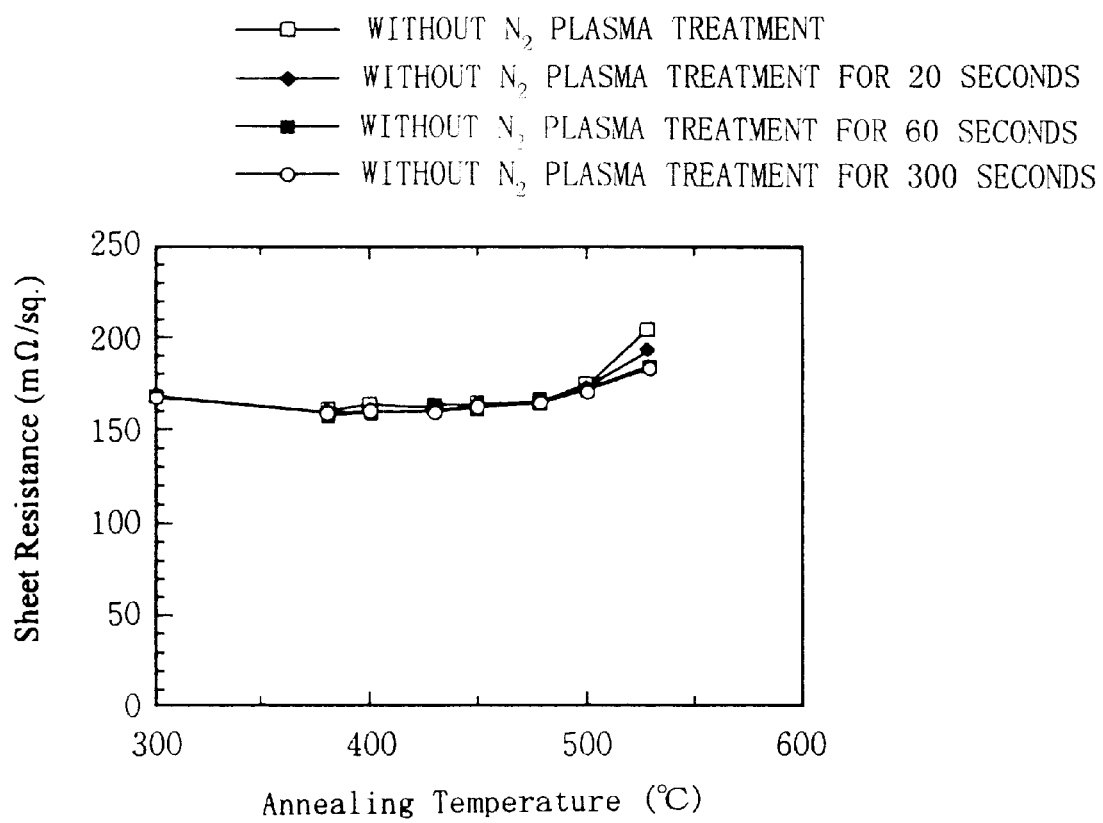
FIG. 11 shows how the sheet resistance of samples depends upon the annealing temperature, wherein each of the samples was subjected to a nitrogen plasma treatment except for one sample and then to an anneal treatment after deposition of an aluminum alloy.
Figure 12:
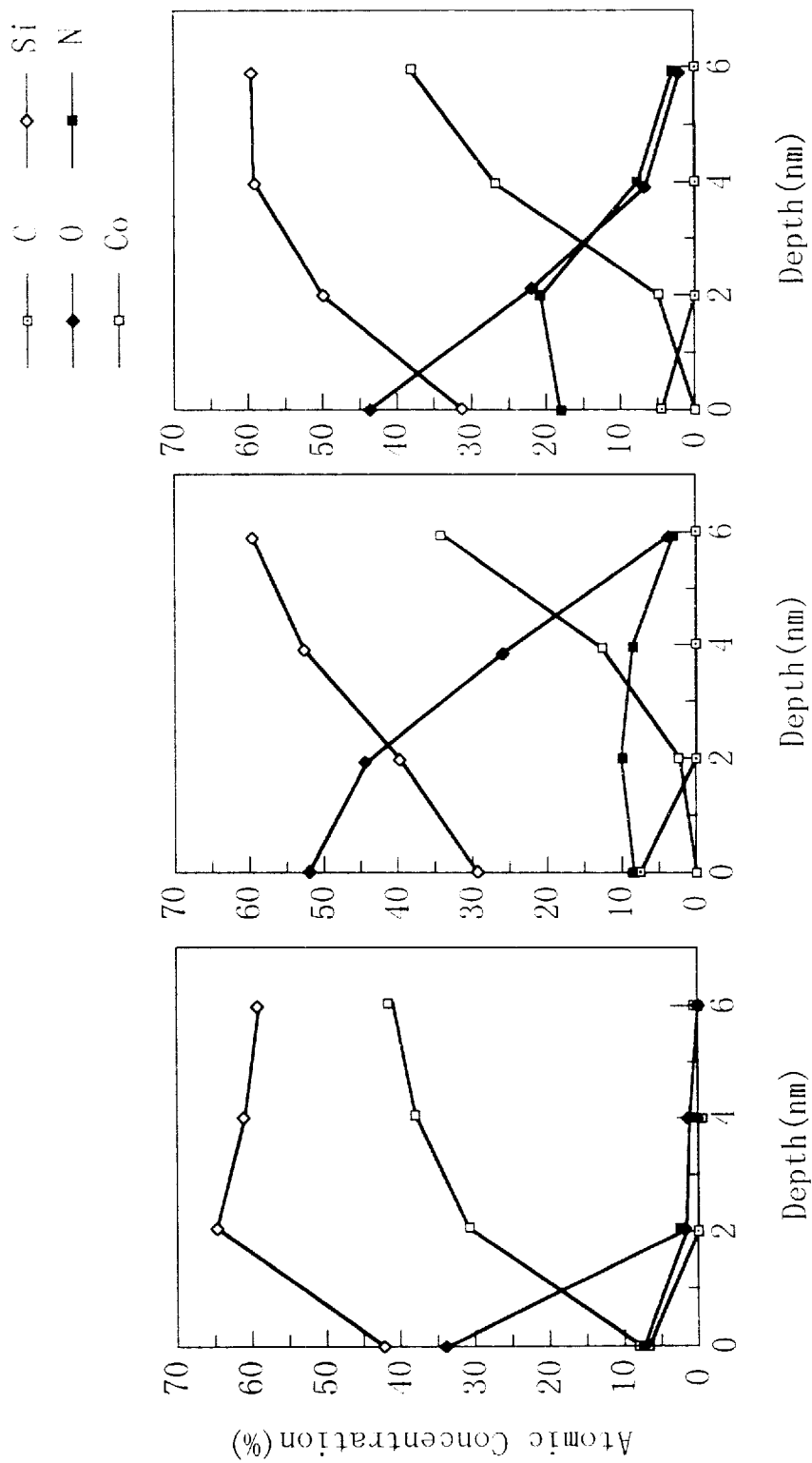
FIG. 12 shows concentration profiles of elements which are the results of analysis, by XPS, of near-surface regions of three different types of cobalt silicide (CoSi2) films, namely (a) a cobalt silicide film without a plasma treatment, (b) a cobalt silicide film with a plasma treatment in an ambient of $N_2$ gas and (c) a cobalt silicide film with a plasma treatment in an ambient of $NH_3$ gas.

FIG. 11 shows how the sheet resistance of samples, each of which was subjected to a nitrogen plasma treatment except for one sample and was then annealed after deposition of aluminum alloy, depends on the anneal temperature. More specifically, (a) nitrogen plasma treatment, shown in FIG. 1(c), was performed to a surface of a 70 nm-thick titanium silicide film in each sample except for one sample, (b) an Al-1% Si-0.5% Cu alloy was deposited to a thickness of 200 nm and (c) annealing was carried out for 30 minutes. The first sample is without a nitrogen plasma treatment. The second sample is with a 20-second nitrogen plasma treatment. The third sample is with a 60-second nitrogen plasma treatment. The fourth sample is with a 300-second nitrogen plasma treatment. FIG. 12 shows that for the case of the third and fourth samples the rise of sheet resistance when annealed at 530 degrees centigrade is suppressed. As can be seen also from FIG. 11, the barrier compound layer, formed on top of the titanium silicide film and composed of a N—O—Ti—Si compound, provides an effect of suppressing reaction between aluminum alloy and titanium silicide.

As described above, in accordance with the present embodiment, nitrogen plasma treatment is performed to a metal silicide film surface, to form thereon a barrier compound layer composed of a nitrogen-oxide-metal-silicon compound. This effectively prevents metal, produced by reaction between metal silicide and aluminum alloy in a later anneal treatment, from entering silicon substrate. In other words, unlike a conventional method, the present embodiment makes it possible to suppress the occurrence of junction leakage without providing a barrier metal such as titanium nitride/nitride film between a buried layer composed of, for example, an aluminum alloy and a metal silicide film. Therefore, deterioration of the reliability of buried layer taking place when a barrier metal is provided, can be avoided. Additionally, contact resistance can be held as low as possible to meet practical requirements. The sheet resistance of the metal silicide film itself can be held sufficiently low.

When a barrier compound layer is also formed in a near-surface region of a metal silicide film on a gate electrode, this prevents metal from entering the gate electrode, thereby preventing the gate oxide film from undergoing degradation in characteristic.

In the present invention, as nitrogen plasma treatment is carried out at low temperature, that is, below 550 degrees centigrade, many of metal silicides can be used without taking aggregation into consideration. In other words, a wider range of selecting a metal material used for metal silicide formation, is obtained.

Second Embodiment

A second embodiment of this invention is now described. Process steps of the fabrication of a semiconductor device of the second embodiment are not illustrated. After process steps, which are the same as the ones shown in FIGS. 1(a)–(c), are carried out, tungsten film 17, which becomes a buried layer, is deposited in connection hole 8 by CVD. Aluminum alloy film 16 is deposited on tungsten film 17 and on insulator film 7, which is then patterned to form metal wiring.

Figure 3:
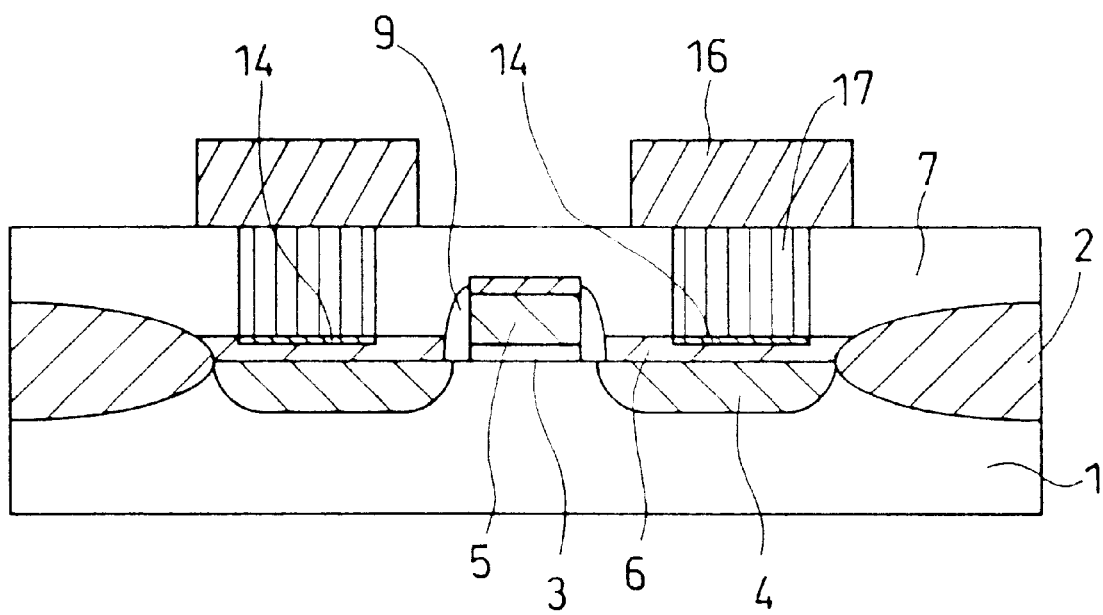
FIG. 3 shows in cross section a semiconductor device of a second embodiment of the present invention.
Figure 4A:
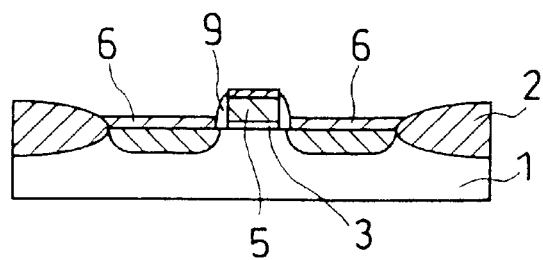
FIGS. 4(a)–(d) are cross-sectional views showing process steps of the fabrication of a semiconductor device in accordance with a third embodiment of the present invention.
Figure 4B:
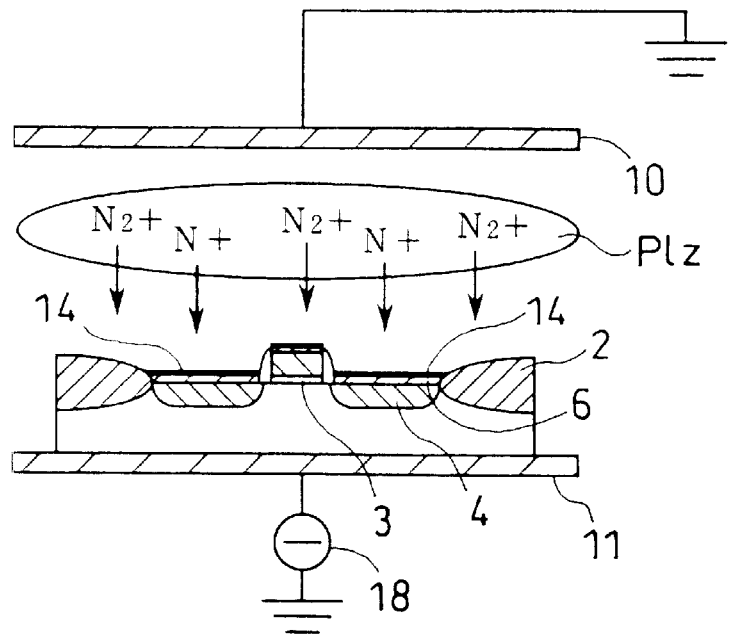
Figure 4C:
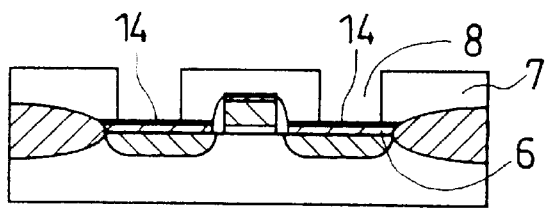
Figure 4D:
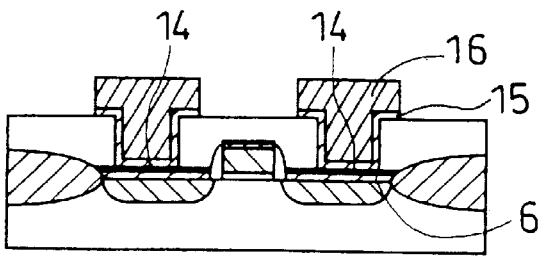

FIG. 3 shows in cross section the structure of a semiconductor device formed in accordance with the present embodiment. Although in the first embodiment the buried layer and metal wiring are formed integrally by Al—Ti compound layer 15 and aluminum alloy film 16, a buried layer of the present embodiment is formed of tungsten film 17 and metal wiring is formed of aluminum alloy film 16. Barrier compound layer 14, composed of a compound of nitrogen, oxygen, titanium and silicon, is formed, only on top of a region of titanium silicide film 6 on source/drain region 4 which becomes a bottom for connection hole 8, and tungsten film 17 and titanium silicide film 6 contact with each other through barrier compound layer 14. To sum up, the semiconductor device of the present invention has the same structure as the first embodiment semiconductor device, with the exception that the buried layer and metal wiring of the present embodiment are formed of different materials from the first embodiment. Accordingly, the present embodiment is able to provide the same effects as the first embodiment.

In addition to the above, the buried layer is formed of tungsten film 17 in the semiconductor device of the present embodiment thereby making temperature, at which reaction, which causes semiconductor device junction leakage, occurs, higher than the case of aluminum alloy. In the present embodiment, owing to barrier compound layer 17, the occurrence of junction leakage, caused by the entering of metal into a silicon substrate by reaction between titanium silicide and tungsten in a later annealing treatment of above 600 degrees centigrade, can be avoided.

Third Embodiment

A third embodiment of the present invention is now described. FIGS. 4(*a*)–(*d*) are cross-sectional views showing process steps of the fabrication of a semiconductor device in accordance with the third embodiment.

With reference to FIG. 4(*a*), a MOS transistor is formed on an active region surrounded by field oxide film 2 on silicon substrate 1. The MOS transistor comprises gate oxide film 3 of silicon oxide, gate electrode 5 of polysilicon, side-wall 9 of silicon oxide and source/drain region 4 formed by doping of impurities into silicon substrate 1. A film of, for example, titanium is deposited on the substrate using sputtering. After annealing of 650 degrees centigrade, unreacted titanium films are removed using an $H_2SO_4$—$H_2O_2$ combined solution, to selectively form titanium silicide film 6 only on source/drain region 4 and on gate electrode 5, to a thickness of about 70 nm. This is followed by an anneal of 850 degrees centigrade for reduction of the resistance of the titanium silicide film.

Next, as shown in FIG. 4(*b*), a plasma generator, comprised of anode 10 and cathode 11 together constituting a parallel-plate electrode and direct-current power supply source 18, is employed. The semiconductor device is placed on cathode 11 arranged in a chamber (not shown in the figure) of the generator and a surface of titanium silicide film 6 is exposed to a plasma of a nitrogen-containing gas such as nitrogen gas. Then, as in the first embodiment, oxygen, contained in a natural oxide layer grown on top of titanium silicide film 6 is also taken into titanium silicide film 6, as a result of which barrier compound layer 14, composed of a nitrogen-oxygen-titanium-silicon compound, is formed in a near-surface region of the entirety of titanium silicide film 6 by $N_2$ gas plasma.

As shown in FIG. 4(*c*), insulator film 7 is formed on the entire surface of the substrate, having a thickness of approximately 800 nm. Connection hole 8 is formed in insulator film 7, which extends to titanium silicide film 6 of source/drain region 4.

A sputtering system is used to sputter titanium by a thickness of about 75 nm (see FIG. 4). This is followed by sputtering of an aluminum alloy, which has a content of 1% silicon and 0.5% copper, by a thickness of about 900 nm at 500 degrees centigrade, to form Al—Ti compound layer 15 composed of an aluminum alloy-titanium combination and to form aluminum alloy film 16 on Al—Ti compound layer 15. At this time, by making use of heat of reaction between Al and Ti, connection hole 8 is filled with aluminum alloy to form a buried layer. Subsequently, Al—Ti compound layer 15 and aluminum alloy film 16 are subjected to a patterning treatment by photolithography to form metal wiring.

Figure 5:
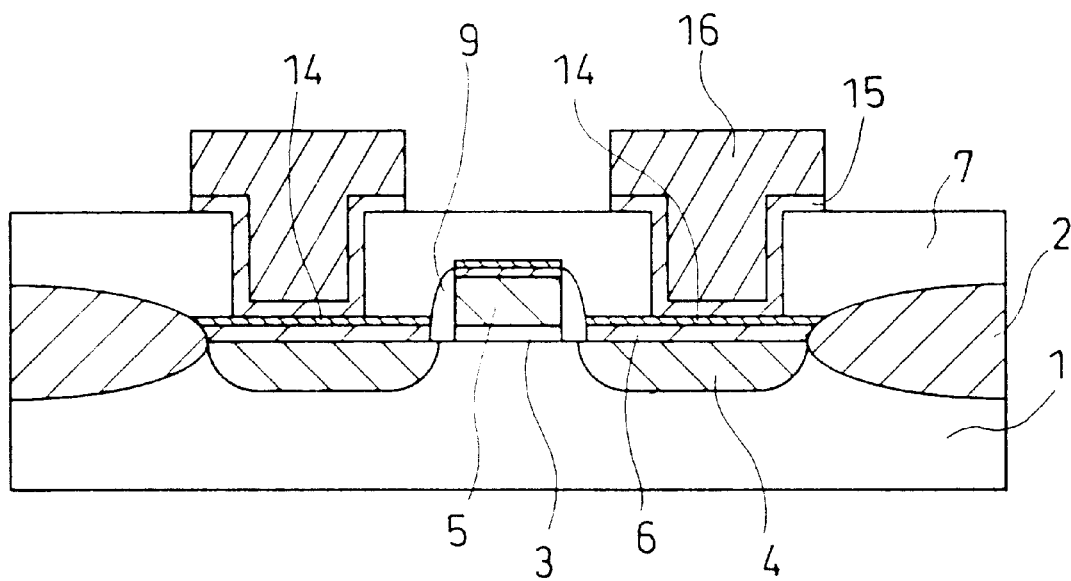
FIG. 5 shows in cross section a semiconductor device of the third embodiment.

FIG. 5 illustrates a cross-sectional structure of a semiconductor device formed in accordance with the above-described fabrication method. Formed on silicon substrate 1 is a MOS transistor which comprises gate oxide film 3, gate electrode 5 of polysilicon film, source/drain region 4, titanium silicide film 6 formed on source/drain region and on gate electrode 5 and side-wall 9. Formed on the entire surface of titanium silicide film 6 is barrier compound layer 14 composed of a N—O—Ti—Si compound. Connection hole 8 is formed in insulator film 7 on the substrate, which extends to titanium silicide film 6 on drain/source region 4. Al—Ti compound layer 15 and aluminum alloy film 16, constituting a buried layer and metal wiring, are formed in connection hole 8 and on insulator film 7. In the first embodiment, barrier compound layer 14 is formed, only on a surface of a region of titanium silicide film 6 on source/drain region which becomes a bottom for connection hole 8. The semiconductor device of the present embodiment is characterized in that barrier compound layer 14 is formed on the entire surface of a titanium silicide film 6 overlying source/drain region 4 as well as on the entire surface of a titanium silicide film 6 overlying gate electrode 5.

Also in the present embodiment, barrier compound layer 14, which is composed of a N—O—Ti—Si compound, is formed in a near-surface region of titanium silicide film 6, therefore providing the same effects that the first embodiment does. Particularly, in accordance with the present embodiment, barrier compound layer 14 is formed not only in a near-surface region of titanium silicide film 6 on source/drain region 4, it is formed also in a near-surface region of titanium silicide film 6 on gate electrode 5. This provides the advantage that, even when forming in gate electrode 5 a contact point from a wiring layer other than Al—Ti compound layer 15 and aluminum alloy film 16 shown in FIG. 4(*d*), such contact can be established through barrier compound layer 14 without having to perform an extra nitrogen plasma treatment.

It is necessary to, before the FIG. 4(*d*) process step (i.e., before the semiconductor device is placed in the sputter system), wet-etch the inside of connection hole 8 with a solution of HF to remove a surface oxides layer of the metal silicide film. However, titanium silicide film 6 is easy to be etched by HF solution. It is deemed that barrier compound layer 14 of the present embodiment, since it contains therein a silicon-nitrogen bond, has a composition similar to SiN, for which reason barrier compound layer 14 is hard to be etched by HF solution. In the present embodiment, resistance of the titanium silicide film to chemical attack is improved and processing margins are increased.

In the semiconductor device of the present embodiment, the fact that barrier compound layer 14 is formed covering the entire surface of titanium silicide film 6, increases the sheet resistance of titanium silicide film 6 to a higher level as compared with the semiconductor devices of the first embodiment. As mentioned in the first embodiment, the rate of rise in sheet resistance is only about 10 percent, which is not so high as affecting the operation of transistors.

Fourth Embodiment

A fourth embodiment of this invention is now described below. Process steps of the fabrication of a semiconductor device according to the present embodiment are not illustrated. After process steps, which are the same as the ones shown in FIGS. 3(a)–(c) of the third embodiment, are carried out, tungsten film 17, which becomes a buried layer, is deposited in connection hole 8 by CVD. Aluminum alloy film 16 is deposited on tungsten film 17 and insulator film 7, which is then patterned to form metal wiring.

Figure 6:
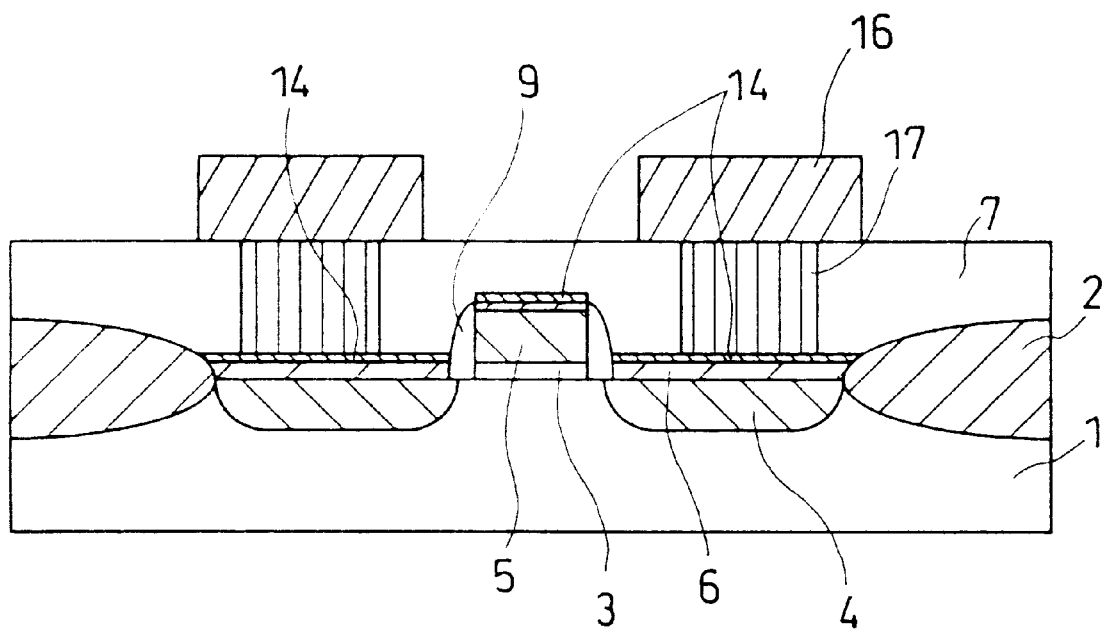
FIG. 6 shows in cross section a semiconductor device in accordance with a fourth embodiment of the present invention.

FIG. 6 shows in cross section the structure of a semiconductor device formed in accordance with the present embodiment. Although in the third embodiment the buried layer and metal wiring are formed integrally by Al—Ti compound layer 15 and aluminum alloy film 16, a buried layer of the present embodiment is formed of tungsten film 17 and metal wiring is formed of aluminum alloy film 16. Barrier compound layer 14, composed of a nitrogen-oxygen-metal-silicon compound, is formed on the entire surface of a titanium silicide film 6 on source/drain region 4 as wells on the entire surface of a titanium silicide film 6 on gate electrode 5, and tungsten film 17 and titanium silicide film 6 contact with each other through barrier compound layer 14. To sum up, the semiconductor device of the present invention has the same structure as the third embodiment semiconductor device, with the exception that the buried layer and metal wiring of the present embodiment are formed of different materials from the third embodiment. Accordingly, the present embodiment is able to provide the same effects as in the third embodiment.

In addition to the above, a buried layer is formed by tungsten film 17 in the semiconductor device of the present embodiment, which provides prevention of reaction between tungsten and titanium silicide. The occurrence of junction leakage, caused by the entering of metal into a silicon substrate by reaction between titanium silicide and tungsten in a later annealing treatment of above 600 degrees centigrade, can be avoided.

Fifth Embodiment

A fifth embodiment of the present invention is illustrated. FIGS. 7(a)–(d) are cross-sectional views showing process steps of the fabrication of a semiconductor device of the present embodiment.

As shown in FIG. 7(a), a MOS transistor is formed on an active region surrounded by field oxide film 2 on silicon substrate 1. The MOS transistor comprises gate oxide film 3 of silicon oxide, gate electrode 5 of polysilicon, side-wall 9 of silicon oxide and source/drain region 4 formed by doping of impurities into silicon substrate 1. A film of, for example, cobalt is deposited on the substrate using sputtering. An anneal is performed at 500 degrees centigrade in an ambient of nitrogen. Unreacted cobalt films are stripped using a $H_2SO_4$—$H_2O_2$ combined solution, whereby cobalt silicide film 24 with a thickness of about 50 nm is selectively formed, only on source/drain region 4 and on gate electrode 5. This is followed by an anneal of 850 degrees centigrade for reduction of the resistance of cobalt silicide film 24.

Next, as shown in FIG. 7(b), a plasma generator is used, which is comprised of upper and lower electrodes 25 and 26 together forming a parallel-plate electrode, high-pass filter 27, low-pass filter 28, 13.56-MHz high-frequency power supply source 29 and 400-KHz high-frequency power supply source 30. The semiconductor device is placed on lower electrode 26 arranged in a reaction chamber (not shown in the figure) of the generator, to expose a surface of cobalt silicide 24 to a nitrogen-containing gas such as nitrogen gas. For example, $N_2$ gas of 100 percent is introduced at a temperature of 400 degrees centigrade at a pressure of 2 Torr, and for 900 seconds, high-frequency power of 800 W is applied by high-frequency power supply source 29 to upper electrode 25 and high-frequency power of 100 W is applied by high-frequency power supply source 30 to lower electrode 26. At this time, a nitrogen plasma Plz is generated in the reaction chamber. This nitrogen plasma Plz is a positive ion such as $N^+$ and $N^{2+}$, and, since lower electrode 26 is lower in frequency than upper electrode 25, nitrogen ions are attracted towards the lower electrode 26. In other words, even when a plasma generator of dual frequency power application type is used, the arrangement that a semiconductor device is placed on an electrode to which electric power from the lower of the two power supply sources in frequency is applied, makes it possible to accelerate the doping of nitrogen into the surface of cobalt silicide film 24. At this time, oxygen, which is present within a natural oxide layer grown on top of cobalt silicide film 24, together with oxygen which remains within the chamber, is taken into cobalt silicide film 24, whereby barrier compound layer 14, composed of a N—O—Co—Si compound, is formed in a near-surface region of cobalt silicide film 24.

With reference to FIG. 7(c), first aluminum film 22 is formed, only on barrier compound layer 14 by selective CVD technique using DMAH (dimethylaluminiumhydride). This selective CVD method with DMAH is a method capable of selectively depositing a film of aluminum only on a conductor layer.

Next, as shown in FIG. 7(d), insulator film 7 is formed on first aluminum film 22, having a thickness of approximately 800 nm. Connection hole 8 is formed in insulator film 7, which extends to first aluminum film 22 located on source/drain region 4.

As shown in FIG. (e), second aluminum film 23 is formed in connection hole 8 by selective CVD with DMAH. Aluminum alloy film 16 is deposited on second aluminum film 23 as well as on insulator film 7 by sputtering. Aluminum alloy film 16 is then patterned using photolithography, to form metal wiring.

Figure 8:
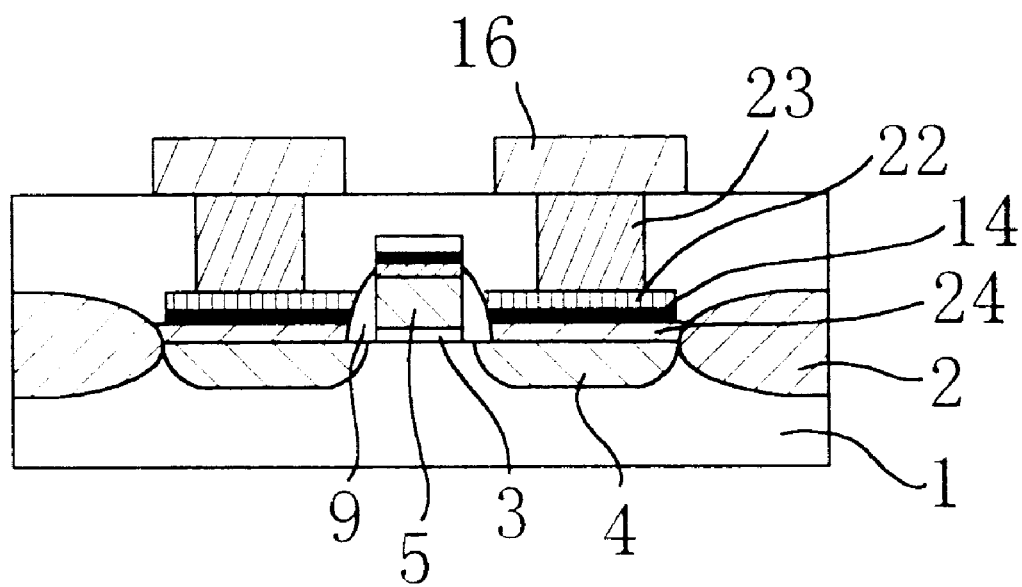
FIG. 8 shows in cross section a semiconductor device of the fifth embodiment.

FIG. 8 shows in cross section the structure of a semiconductor device formed according to the above-described fabrication method. Formed on silicon substrate 1 is a MOS transistor that comprises gate oxide film 3, gate electrode 5 of polysilicon, source/drain region 4, cobalt silicide film 24 formed on source/drain region 4 and on gate electrode 5 and side-wall 9. Barrier compound layer 14, composed of a N—O—Co—Si compound, is formed overlying the entire surface of cobalt silicide film 24, and first aluminum film 22 is formed on barrier compound layer 14 of cobalt silicide film 24. Connection hole 8 is formed in insulator film 7 on the substrate, which extends to first aluminum film 22 located on source/drain region 4. Second aluminum film 23 that acts as a buried layer is formed in connection hole 8. Formed on second aluminum film 23 and insulator film 7 is aluminum alloy film 16 constituting metal wiring. The semiconductor device of the present embodiment is characterized in that (a) barrier compound layer 14 is formed on the entire surface of a cobalt silicide film 24 on source/drain region 4, and on the entire surface of a cobalt silicide film 241 on gate electrode 5 and (b) the aluminum film (low-resistance layer) which is low in electric resistance is formed overlying cobalt silicide film 24.

The structure of barrier compound layer 14 of the semiconductor device according to the present embodiment is described in detail, and the effect of reaction prevention of first aluminum film 22 in the present semiconductor device, is also described in detail.

FIG. 12 shows concentration profiles of elements which are the results of analysis, by XPS method, of near-surface regions of three different types of cobalt silicide films, namely (a) a first cobalt silicide film without a plasma treatment, (b) a second cobalt silicide film with a plasma treatment in an ambient of $N_2$ gas and (c) a third cobalt silicide film with a plasma treatment in an ambient of $NH_3$ gas. In FIGS. 12(a)–(c), the abscissa indicates the depth from the surface while the ordinate indicates the atomic concentration. An annealing treatment was performed to the first cobalt silicide film (i.e., the without-plasma-treatment cobalt silicide film) in an ambient of nitrogen at 750 degrees centigrade so that nitrogen was doped to a near-surface region of the first cobalt silicide film (see FIG. 12(a)). However, in the first cobalt silicide film, the doped nitrogen has a peak concentration at a surface point, and the concentration decreases from the surface inward and finally becomes zero at a depth of approximately 2 nm. Additionally, the oxygen concentration also decreases to such an extent that it becomes almost negligible at a depth of approximately 2 nm. On the other hand, for the cases of the second cobalt silicide film with a plasma treatment in an ambient of $N_2$ gas and the third cobalt silicide film with a plasma treatment in an ambient of $NH_3$ gas, the nitrogen concentration peaks at a depth of about 2 nm from the surface, and area with a high oxygen concentration extends up to a depth of about 6 nm from the surface. This shows that, in the cobalt silicide films with a plasma treatment in an ambient of nitrogen, a barrier compound layer, composed of a nitrogen-oxygen-cobalt-silicon compound, is formed at a range from the surface down to a depth of approximately 6 nm.

In the present embodiment, owing to the fact that barrier compound layer 14 is formed in the vicinity of the surface of cobalt silicide film 24, the electric resistance of cobalt silicide film 24 increases from 3.5 $\Omega/\square$ up to 3.6 $\Omega/\square$. However, the increase rate is below 10 percent and such an increase is not so high as affecting, for example, the operation of transistors.

Figure 13:
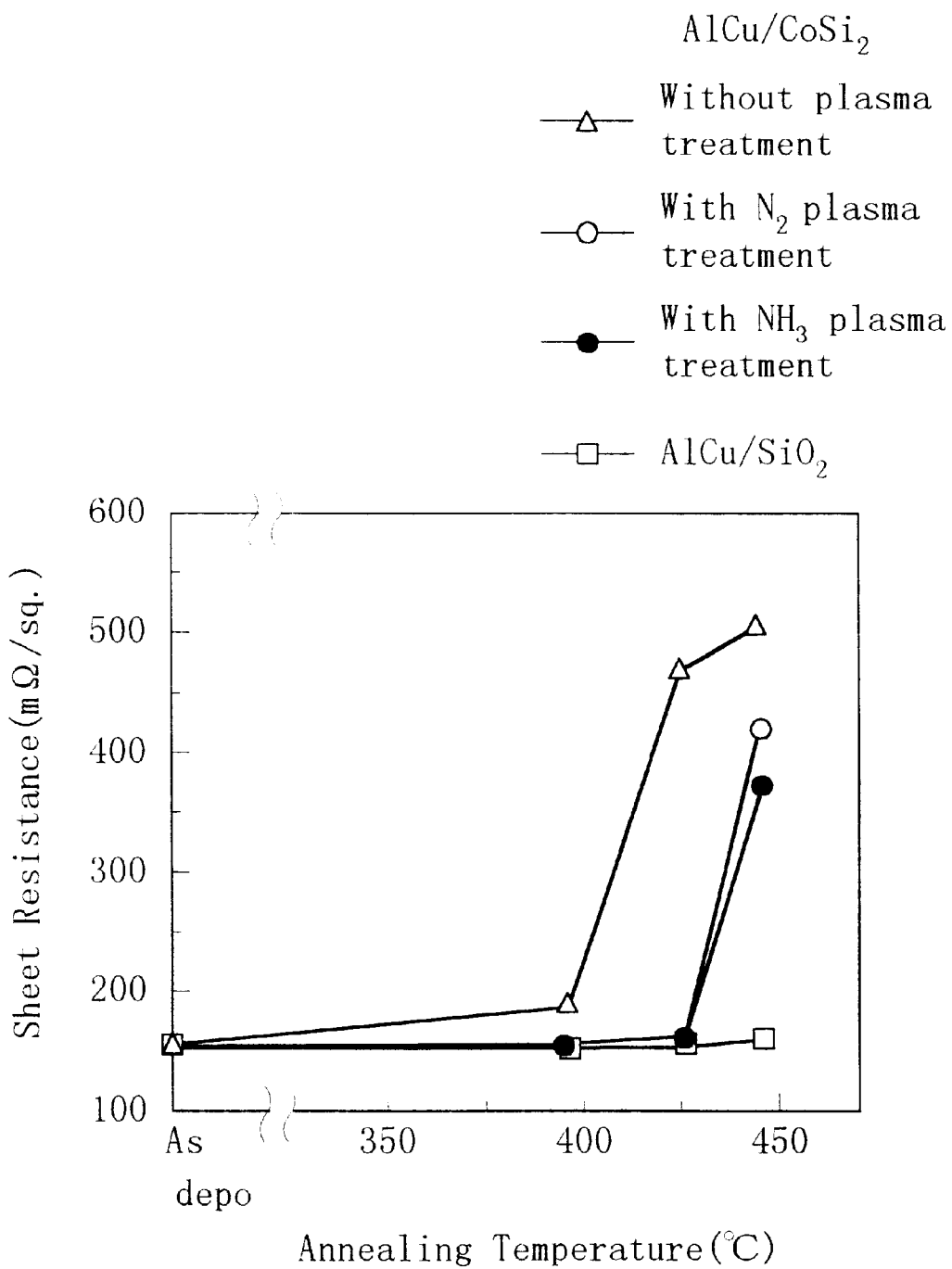
FIG. 13 shows how the sheet resistance of each of (a) an Al—Cu/CoSi$_2$ structure without a plasma treatment (b) an Al—Cu/CoSi$_2$ structure with a $N_2$ plasma treatment and (c) an Al—Cu/CoSi$_2$ structure with a $NH_3$ plasma treatment, depends upon the annealing temperature.

FIG. 13 shows how the sheet resistance of each of samples depends on the annealing temperature. Each sample was prepared by performing an anneal after deposition of an Al-0.5% Cu film as a first aluminum film on a respective cobalt silicide film. The cobalt silicide film samples used are (a) a first cobalt silicide film with a $N_2$ plasma treatment for 900 seconds, (b) a second cobalt film with a $NH_3$ plasma treatment for 900 seconds and (c) a third cobalt silicide film without a plasma treatment. More specifically, the plasma treatment was performed by illuminating 50-nm thick cobalt silicide films of the first and second samples with a nitrogen plasma in an ambient of $N_2$ gas and with a nitrogen plasma in an ambient of $NH_3$ gas, respectively. In each sample, an Al-0.5% Cu alloy film was deposited on a respective cobalt silicide film to a thickness of about 200 nm and an anneal was performed for about 30 minutes.

From FIG. 13, the without-plasma-treatment sample, when annealed at 400 degrees centigrade, shows only a slight increase in sheet resistance. The without-plasma-treatment sample, however, shows a considerable increase in sheet resistance when annealed at 430 degrees centigrade. On the other hand, in the case of the with-plasma-treatment samples the increase in sheet resistance is held low when annealed at 400 degrees centigrade and even when annealed at 430 degrees centigrade. This is explained by the fact that the formation of the barrier compound layer on top of the cobalt silicide film functions to suppress the reaction of aluminum and cobalt silicide. Generally, sintering is performed at temperatures ranging from 400 to 450 degrees centigrade, so that such a sheet-resistance suppression effect provides a considerable advantage in practical applications.

The with- and without-plasma-treatment samples, annealed at 430 degrees centigrade, were XPS-analyzed. In the without-plasma-treatment sample, $Co_2Al_{19}$ or $Co_4Al_3$ alloy was formed. On the other hand, in the with-plasma-treatment samples, only peaks for Al and $CoSi_2$ were found to be present. The X-ray analysis shows that reaction of Al and $CoSi_2$ is suppressed up to an annealing temperature of 430 degrees centigrade.

In accordance with the present embodiment, a nitrogen plasma treatment is performed to a surface of metal silicide, to form a barrier compound layer, composed of a compound of nitrogen, oxygen, metal and silicon, on top of the metal silicide. This effectively prevents metal, produced by reaction of metal silicide and aluminum alloy in a later annealing treatment, from entering silicon substrate. Conventionally, barrier compound layers are formed by subjecting silicide films to an anneal treatment of above 800 degrees centigrade. The present embodiment eliminates the need for such annealing and, as a result, the problem that boron present in source/drain region is drawn into a metal silicide film leading to a drop in value of this saturation current of P-channel transistor, is solved. Additionally, in the present embodiment, nitrogen plasma treatment is carried out at low temperature, i.e., below 550 degrees centigrade. This provides the effect that many of metal silicide suffer no aggregation, in other words a wider range of selection of metal material from which to make a metal silicide film is provided.

Other Embodiments

Either in the first embodiment or in the third embodiment, metal wiring on connection hole 8 is formed of aluminum alloy film 16 and Al—Ti compound layer 15. Al—Ti compound layer 15 may be a metal layer composed of a different metal or its compound, or the provision thereof may be omitted. An extra metal film may be formed on aluminum alloy film 16. An aluminum alloy that contains silicon and copper is used to form aluminum alloy film 16. However, as material from which to form aluminum alloy film 16, a different aluminum alloy that contains, for example only silicon or a different metal such as scandium, or pure aluminum may be employed. Additionally, copper or copper alloy may be used in place of aluminum alloy.

In each of the foregoing embodiments, $N_2$ is used as a nitrogen-containing gas. It may be arranged such that $NH_3$ gas or $H_2$ gas flows to remove a natural oxide film grown on top of a metal silicide film and a plasma is generated in an ambient of $N_2$ gas with an addition of a very small amount of $O_2$ gas to form a barrier compound layer composed of a compound of N, O, Ti and Si. Since it is possible to control the amount of oxygen, this makes it possible to allow the distribution of elements in the barrier compound layer to approach the most suitable state possible, whereby an improved semiconductor device, having a barrier compound layer with a lower contact resistance and a greater junction leakage prevention effect than in cases where natural oxide is utilized, can be fabricated.

Even when carrying out a plasma treatment with $NH_3$ gas, no inconvenience is produced by performing the treatment at below 550 degrees centigrade, unlike the above-described case in which plasma treatment is performed at about 800 degrees centigrade to form titanium nitride. Further, even when carrying out a $NH_3$ plasma treatment, the effect of the present invention can be expected as long as formation conditions capable of forming a barrier compound layer of a compound of nitrogen, oxygen, metal such as titanium and silicon, are used.

Figure 14:
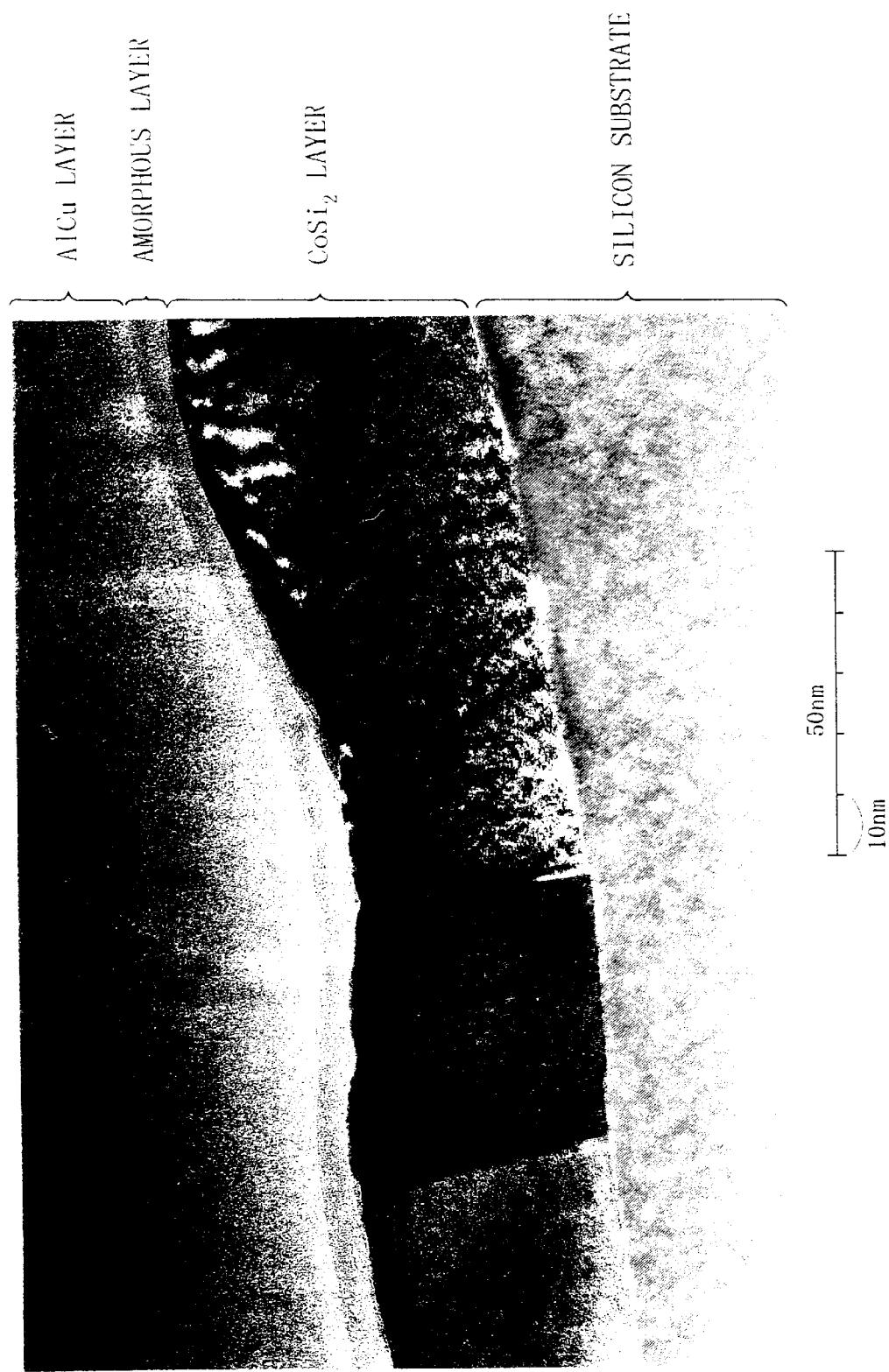
FIG. 14 is a TEM photograph of a near-boundary portion of an AlCu/CoSi$_2$ structure with a $NH_3$ plasma treatment.
Figure 15A:
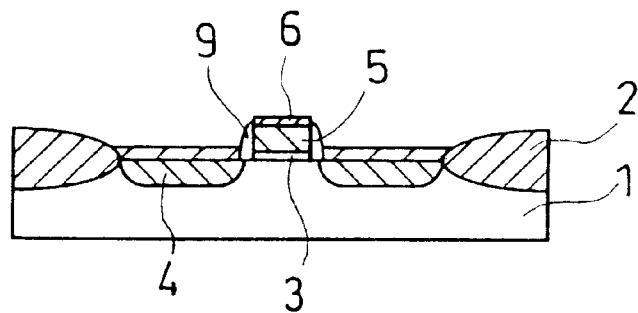
FIGS. 15(a)–(d) are cross-sectional views showing process steps of the fabrication of a semiconductor device of a prior art fabrication technique.
Figure 15B:
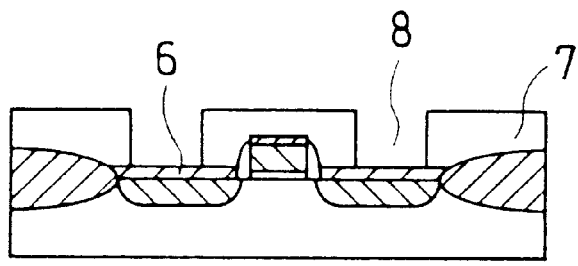
Figure 15C:
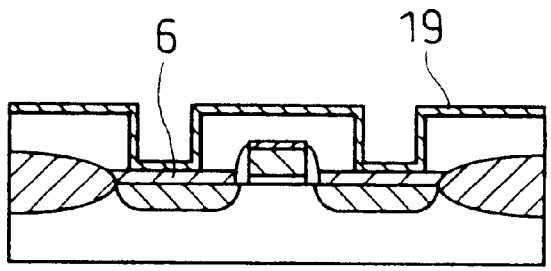
Figure 15D:
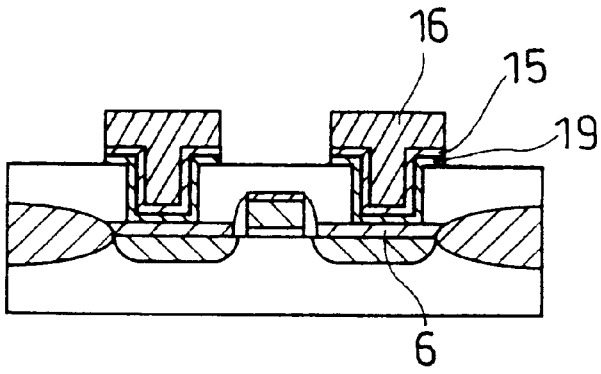

FIG. 14 is a TEM photograph showing a barrier compound layer formed, by a NH₃ plasma treatment, on top of a cobalt silicide surface. The same plasma generation conditions as used in the fifth embodiment are used. The TEM photograph of FIG. 14 shows that a N—O—Co—Si compound layer, which is an amorphous layer, is formed having a thickness of from about 4 nm to about 6 nm. Further, as can be seen from FIG. 13, the increase in sheet resistance caused by reaction of aluminum and cobalt silicide in an annealing treatment, is suppressed up to a temperature of 430 degrees centigrade, and a reaction suppression effect of the same level as the one obtained in cases where $N_2$ is used, is provided. The reason may be that the use of NH₃ reduces the atomic concentration of oxygen in the compound layer while it increases the atomic concentration of nitrogen so that both the concentrations are adequately adjusted.

Different plasma generation conditions other than the foregoing ones may be used.

The step of forming a compound layer by subjecting a surface of a titanium or cobalt silicide film to a nitrogen plasma treatment may be performed, immediately before copper, aluminum, tungsten or their alloy is deposited in a connection hole either in a sputter system or in a selective CVD system, in the system. Alternatively, the step may be performed immediately before copper, aluminum, tungsten or their alloy is formed by selective CVD only on top of a barrier compound layer, in the same system.

In each of the foregoing embodiments, titanium silicide is used to form a metal silicide film. Cobalt silicide, nickel silicide, tantalum silicide, tungsten silicide, niobium silicide, palladium silicide, platinum silicide or molybdenum silicide may be used to form a metal silicide film.

Additionally, in each of the foregoing embodiment, instead of exposing a surface of a metal silicide film to a plasma of a nitrogen-containing gas in the step of forming a barrier compound layer composed of a compound of nitrogen, oxygen, metal and silicon, the surface may be illuminated either with ultraviolet light or with ionizing radiation while, at the same time, being exposed to a nitrogen-containing gas, to form on top of the metal silicide film a barrier compound layer, composed of a compound of nitrogen, oxygen, metal and silicon, at low temperature of below 550 degrees centigrade by making utilization of ultraviolet light energy. Alternatively, instead of using a plasma, the metal silicide film surface may be exposed to nitrogen-containing ion beams to form on top of the metal silicide film a barrier compound layer, composed of a compound of nitrogen, oxygen, metal and silicon, at low temperature of below 550 degrees centigrade by making utilization of ion energy.

In the first to fourth embodiments, it is preferred that, in the step of forming a barrier compound layer composed of a compound of nitrogen, oxygen, metal and silicon, a potential used for attracting nitrogen ions towards metal silicide is below about 3 keV in any one of plasma treatment, ultraviolet light illumination and ion beam illumination. The reason is explained. It is assumed from the range of nitrogen ion in silicon that, when the potential is 1 keV, the nitrogen concentration peaks at a depth of 3.8 nm and decreases to 10 percent at a depth of 9.8 nm. On the other hand, when the potential is 3 keV, the nitrogen concentration peaks at a depth of 8.5 nm and decreases to 10 percent at a depth of 20.3 nm. This makes it possible to suppress formation of a barrier compound layer to a depth of about 20 nm, which is 30 percent of the thickness of general silicide films, about 70 nm thick), whereby the increase in sheet resistance and the increase in contact resistance can be avoided.

In the present invention, metal silicide, on which a barrier compound film is formed, is formed on the gate electrode and source/drain region. However, in cases where polysilicon films are used as an element of a resistor or capacitor, particularly as an electrode, a film of silicide may be formed overlying a polysilicon film. Even in such a case, the formation of a barrier compound layer, composed of a nitrogen-oxygen-metal-silicon compound, on top of the metal silicide film that is brought into contact with upper-level wiring, effectively prevents metal or the like produced by reaction of metal silicide and buried layer from entering the electrode or other members through the electrode, without having to deposit barrier metal in a connection hole.

In the fifth embodiment, barrier compound layer 14, composed of a compound of nitrogen, oxygen, metal and silicon, is formed on the entire surface of cobalt silicide film 24 located over source/drain region 4 as well as on the entire surface of cobalt silicide film 24 located over gate electrode 5, and first aluminum film 22 and titanium silicide film 6 contact with each other through barrier compound layer 14. Instead of first aluminum film 22, a film of an aluminum-containing metal, a copper-containing metal or a tungsten-containing metal may be deposited, with the same effects as obtained in the case of depositing first aluminum film 22. For example, even when a film of tungsten is employed in place of first aluminum film 22, the existence of barrier compound layer 14 functions to prevent metal produced by reaction of cobalt silicide and tungsten in a later annealing treatment at above 600 degrees centigrade, from entering silicon substrate thereby leading to junction leakage.

The invention claimed is:

1. A method of fabricating a semiconductor device comprising:
   (a) a first step of forming on a semiconductor substrate a metal silicide film composed of a compound of a first metal and silicon;
   (b) a second step of forming, at a near-surface region of said metal silicide film, a barrier compound layer which is composed of a nitrogen-oxygen-first metal-silicon compound by illuminating a surface of said metal silicide film with nitrogen-containing ions either in an oxidation ambient or in a neutral ambient; and
   (c) a third step of forming a metal film on top of said barrier compound layer of said metal silicide film using a CVD technique, said metal film being in direct contact with said barrier compound layer and comprising, a second metal which comprises one metal selected from a group consisting of an aluminum-containing metal, a copper-containing metal and a tungsten-containing metal.

2. A semiconductor device fabrication method of claim 1, wherein:
   (a) said semiconductor device fabrication method further includes:
      after said first step and before said second step, forming an insulator film on said metal silicide film;
      forming, by selective removal of a portion of said insulator film, a connection hole which extends to said metal silicide film;
   (b) in said second step, said barrier compound layer is formed in an area of said near-surface region of said metal silicide film exposed to a bottom portion of said connection hole; and
   (c) in said third step, said connection hole is filled with said second metal.

3. A semiconductor device fabrication method of claim 1, wherein:
(a) said semiconductor device fabrication method further includes:
  after said second step, forming an insulator film on said barrier compound layer of said metal silicide film;
  forming, by selective removal of a portion of said insulator film, a connection hole which extends to said barrier compound layer; and
(b) in said third step, said second metal is deposited in said connection hole.

4. A semiconductor device fabrication method of claim 1, said semiconductor device fabrication method further including after said third step;
(a) forming an insulator film on said barrier compound layer of said metal silicide film;
(b) forming, by selective removal of a portion of said insulator film, a connection hole which extends to said barrier compound layer; and
(c) forming, by deposition of a third metal in said connection hole, a buried layer.

5. A semiconductor device fabrication method of claim 1 wherein in said second step of a plasma generator, in which a lower electrode as a cathode and an upper electrode as an anode are arranged in a chamber of said generator, is used and wherein, with said semiconductor substrate placed on said lower electrode, said metal silicide film is exposed to a plasma of a nitrogen-containing gas to form said barrier compound layer.

6. A semiconductor device fabrication method of claim 1 wherein in said second step a surface of said metal silicide film is illuminated either with ultraviolet light or with ionizing radiation while at the same time being exposed to a nitrogen-containing gas.

7. A semiconductor device fabrication method of claim 1 wherein in said second step a surface of said metal silicide film is exposed to nitrogen-containing ion beams to form said barrier compound layer.

8. A semiconductor device fabrication method of claim 1 wherein said second step is performed at 550 degrees centigrade or less.

9. A semiconductor device fabrication method of claim 1 wherein in said second step said nitrogen-containing gas is $N_2$ gas.

10. A semiconductor device fabrication method of claim 1 wherein said semiconductor device fabrication method further includes, before said second step, removing a natural oxide layer on said metal silicide film by introducing a hydrogen-containing gas and wherein in said second step an oxygen-containing gas is added.

11. A semiconductor device fabrication method of claim 1 wherein in said second step nitrogen-containing ions are doped into said metal silicide film at an ion energy of 3 keV or less.

12. A semiconductor device fabrication method of claim 1 wherein in said first step a silicide of any one of titanium, cobalt, nickel, tantalum, tungsten, niobium, palladium, platinum or molybdenum is used to form said metal silicide film.

* * * * *